United States Patent
Goktepeli et al.

(10) Patent No.: US 7,235,847 B2
(45) Date of Patent: Jun. 26, 2007

(54) SEMICONDUCTOR DEVICE HAVING A GATE WITH A THIN CONDUCTIVE LAYER

(75) Inventors: Sinan Goktepeli, Austin, TX (US); Alexander A. Demkov, Austin, TX (US); Marius K. Orlowski, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/944,306

(22) Filed: Sep. 17, 2004

(65) Prior Publication Data

US 2006/0060928 A1   Mar. 23, 2006

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. .................................. 257/368; 257/407
(58) Field of Classification Search ........ 257/382–412, 257/368; 438/300–305, 383–393
See application file for complete search history.

(56) References Cited

U.S. PATENT DOCUMENTS

| | | | |
|---|---|---|---|
| 6,579,775 B2 * | 6/2003 | Kizilyalli et al. | 438/383 |
| 6,593,634 B2 * | 7/2003 | Ohmi et al. | 257/412 |
| 6,627,528 B1 * | 9/2003 | Ishimaru | 257/903 |
| 6,696,327 B1 | 2/2004 | Brask | |
| 6,709,911 B1 | 3/2004 | Doczy | |
| 6,713,358 B1 | 3/2004 | Chau | |
| 6,716,707 B1 | 4/2004 | Brask | |
| 6,737,362 B1 | 5/2004 | Chen | |
| 6,740,941 B2 | 5/2004 | Moriwaki | |
| 2004/0106287 A1 | 6/2004 | Chau | |
| 2004/0108557 A1 | 6/2004 | Barnak | |
| 2004/0110361 A1 | 6/2004 | Parker | |

* cited by examiner

*Primary Examiner*—Cuong Nguyen
(74) *Attorney, Agent, or Firm*—Susan C. Hill; Joanna G. Chiu

(57) ABSTRACT

A semiconductor device (10) having a gate (16, 18 or 16, 18, 26, 28) with a thin conductive layer (18) is described. As the physical dimensions of semiconductor devices are scaled below the sub-micron regime, very thin gate dielectrics (16) are used. One problem encountered with very thin gate dielectrics is that the carriers can tunnel through the gate dielectric material, thus increasing the undesirable leakage current in the device. By using a thin layer for conductive layer (18), quantum confinement of carriers within conductive layer (18) can be induced. This quantum confinement removes modes which are propagating in the direction normal to the interfacial plane 15 from the Fermi level. Thus, the undesirable leakage current in the device (10) can be reduced. Additional conductive layers (e.g. 28) may be used to provide more carriers.

25 Claims, 3 Drawing Sheets

SEMICONDUCTOR DEVICE HAVING A GATE WITH A THIN CONDUCTIVE LAYER

FIELD OF THE INVENTION

The present invention relates generally to semiconductor devices, and more particularly to semiconductor devices having a gate with a thin conductive layer.

RELATED ART

Transistors, as is well known in the art, are the building blocks of all integrated circuits. Modern integrated circuits interconnect literally millions of densely configured transistors that perform a wide variety of functions. Achieving such a dramatic increase in the density of circuit components has required microelectronic manufacturers to scale down the physical dimensions of the transistor below the sub-micron regime. One common type of transistor used in a sub-micron microelectronic device utilizes a polysilicon gate electrode. However, polysilicon gate electrodes may suffer device performance degradation due to the polysilicon depletion effect, wherein an electric field applied to a polysilicon gate sweeps away carriers (holes in a P-type doped polysilicon, or electrons in an N-type doped polysilicon) so as to create a depletion of carriers in the area of the polysilicon gate near the underlying gate dielectric of the transistor. This depletion effect results in a reduction in the strength of the electric field at the surface of the microelectronic device when a voltage is applied to the polysilicon gate electrode, which can have an adverse affect on the transistor performance.

One way of improving the performance of sub-micron microelectronic transistors is to use metal gate electrode technology. While replacing traditional polysilicon gate electrodes with metal or metal alloy gate electrodes eliminates the polysilicon depletion effect, there are problems associated with the use of such metal gates.

As the physical dimensions of the transistor are scaled below the sub-micron regime, very thin gate dielectrics are used. One problem encountered with very thin gate dielectrics is that the carriers from the gate can tunnel through the underlying gate dielectric material, thus increasing the undesirable leakage current in the microelectronic device. High-k dielectrics may be helpful in addressing this problem. However, other solutions are also needed.

BRIEF DESCRIPTION OF THE DRAWINGS

The present invention is illustrated by way of example and not limited by the accompanying figures, in which like references indicate similar elements, and in which.

Figure 1:
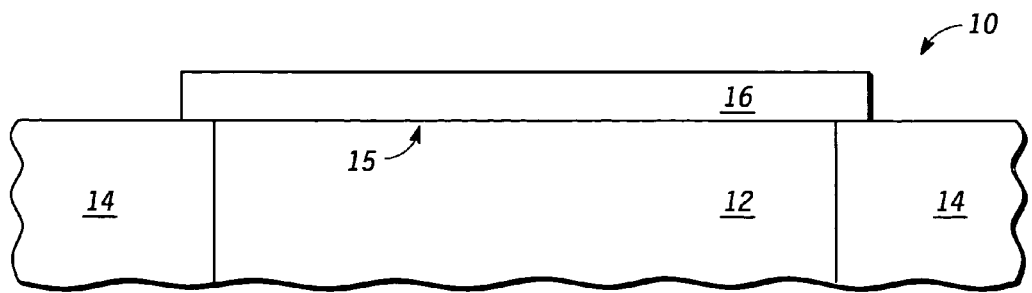
FIGS. 1–4 illustrate, in cross-sectional view form (the cross-section is made normal the line connecting the source and drain), a structure that may be formed in accordance with one embodiment of the present invention.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments. In addition, it is to be understood that the location or arrangement of individual elements within each disclosed embodiment may be modified. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

As the physical dimensions of the transistor are scaled below the sub-micron regime, very thin gate dielectrics are used. One problem encountered with very thin gate dielectrics is that the carriers from the gate can tunnel through the underlying gate dielectric material, thus increasing the undesirable leakage current in the microelectronic device. By using a thin layer for conductive layer 18 (see FIGS. 4 and 7), quantum confinement of carriers within conductive layer 18 can be induced. This quantum confinement removes modes which are propagating in the direction normal to the interfacial plane 15 from the Fermi level. Thus, using a thin layer for conductive layer 18 reduces the number of carriers which have sufficient momentum in the direction normal to the interfacial plane 15 to actually tunnel from conductive layer 18, through the dielectric layer 16, to the channel region 9. As a result, the undesirable leakage current in the microelectronic device 10 can be reduced.

FIG. 1 illustrates, in cross-sectional view form, a structure 10 that may be formed in accordance with one embodiment of the present invention. In one embodiment, the structure 10 forms a transistor wherein the cross-sectional view cuts through the gate region within substrate 12. The source region is thus in front of the structure illustrated in the cross-sectional view and the drain region is behind the structure illustrated in the cross-sectional view. In alternate embodiments, structure 10 may be any type of semiconductor device, or a portion of a semiconductor device. Isolation regions 14 are used to provide electrical isolation for structure 10.

In FIGS. 1–4, a thin gate dielectric layer 16 is formed on a substrate 12. In one embodiment, dielectric layer 16 overlies and is in physical contact with substrate 12. The substrate 12 may be comprised of materials such as, but not limited to, silicon, silicon-on-insulator, any semiconductor-on-insulator, germanium, indium antimonide, lead telluride, indium arsenide, indium phosphide, gallium arsenide, gallium antimonide, or combinations thereof. Although several examples of materials from which the substrate 12 may be formed are described here, any material may be used that can serve as a foundation upon which a microelectronic device may be built. Substrate 12 may also be comprised of a plurality of stacked layers.

In a currently preferred embodiment, the gate dielectric layer 16 comprises silicon dioxide. By way of illustration and not limitation, the gate dielectric layer 16 may also include silicon oxide/silicon nitride stacks, nitrided oxides of silicon, or other dielectric materials with electrical properties suitable for use as a semiconductor device gate dielectric layer 16. The gate dielectric layer may further include materials that may be used to make high-k gate dielectrics (i.e. dielectrics having a dielectric constant that is greater than approximately 8) such as hafnium oxide, zirconium oxide, titanium oxide, and aluminum oxide. Although a few examples of materials that may be used to form the gate dielectric layer 16 are described here, that layer may be made from other materials that serve to reduce gate leakage from the level present in devices that include silicon dioxide gate dielectrics. In alternate embodiments, dielectric layer 16 may also be comprised of a plurality of stacked dielectric layers.

The gate dielectric layer 16 may be formed on the substrate 12 using thermal oxidation or a deposition method known in the art, such as a chemical vapor deposition ("CVD"), a low pressure CVD deposition ("LPCVD"), a physical vapor deposition ("PVD"), or an atomic layer deposition ("ALD") process. In most applications, the gate dielectric layer should be less than approximately 10 nanometers thick, and more preferably, between approximately 0.7 nanometers and approximately 6 nanometers thick.

Figure 2:
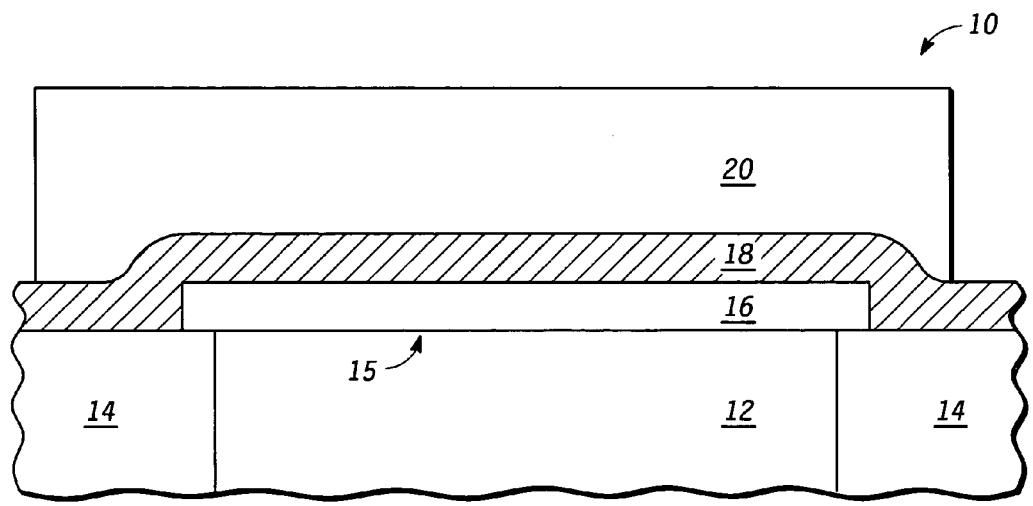

Following the formation of the gate dielectric layer 16, a gate electrode may be formed on the gate dielectric layer (see FIG. 2). In one embodiment, a gate electrode may be formed by depositing a conductive layer 18. Conductive layer 18 may be deposited on the gate dielectric layer 16 using conventional methods known in the art, such as a PVD, ALD, CVD, or a metal organic chemical vapor deposition (MOCVD) process, or electron beam evaporation. The conductive layer 18 can be between approximately 0.9 nanometers to 4.0 nanometers thick, at most approximately 4.0 nanometers preferred for one embodiment, at most approximately 3.7 nanometers preferred for an alternate embodiment, at most approximately 3.5 nanometers preferred for an alternate embodiment, at most approximately 3.2 nanometers preferred for an alternate embodiment, at most approximately 3.0 nanometers preferred for an alternate embodiment, at most approximately 2.7 nanometers preferred for an alternate embodiment, at most approximately 2.5 nanometers preferred for an alternate embodiment, at most approximately 2.3 nanometers preferred for an alternate embodiment, at most approximately 2.0 nanometers preferred for an alternate embodiment, at most approximately 1.7 nanometers preferred for an alternate embodiment, at most approximately 1.5 nanometers preferred for an alternate embodiment, at most approximately 1.2 nanometers preferred for an alternate embodiment, at most approximately 1.0 nanometers preferred for an alternate embodiment, and at most approximately 0.9 nanometers preferred for an alternate embodiment.

The material chosen for the conductive layer 18 comprises any conductive layer, such as but not limited to, aluminum, copper, gold, silver, hafnium, nickel, platinum, cobalt, tantalum, tantalum carbide, molybdenum, tungsten, chromium, titanium nitride, tungsten nitrocarbide, or combinations, compounds, or alloys of any metals or appropriate materials. Although a few examples of materials that may be used to form conductive layer 18 are described here, conductive layer 18 may be made from other materials whose work functions are suitable as either an n-channel or p-channel electrode, or that may be modified or tuned by alloying, combining, or compounding with another material that is suitable to form a gate electrode on the gate dielectric layer 16. Conductive layer 18 may also be comprised of a plurality of stacked conductive layers.

Figure 3:
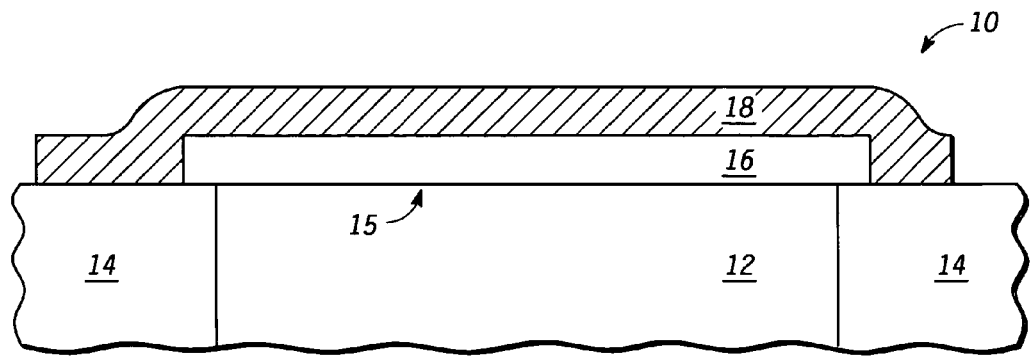

Referring to FIG. 2, in one embodiment, patterned masking layer 20 may be used to pattern conductive layer 18. FIG. 3 illustrates conductive layer 18 after patterning in accordance with one embodiment.

Figure 4:
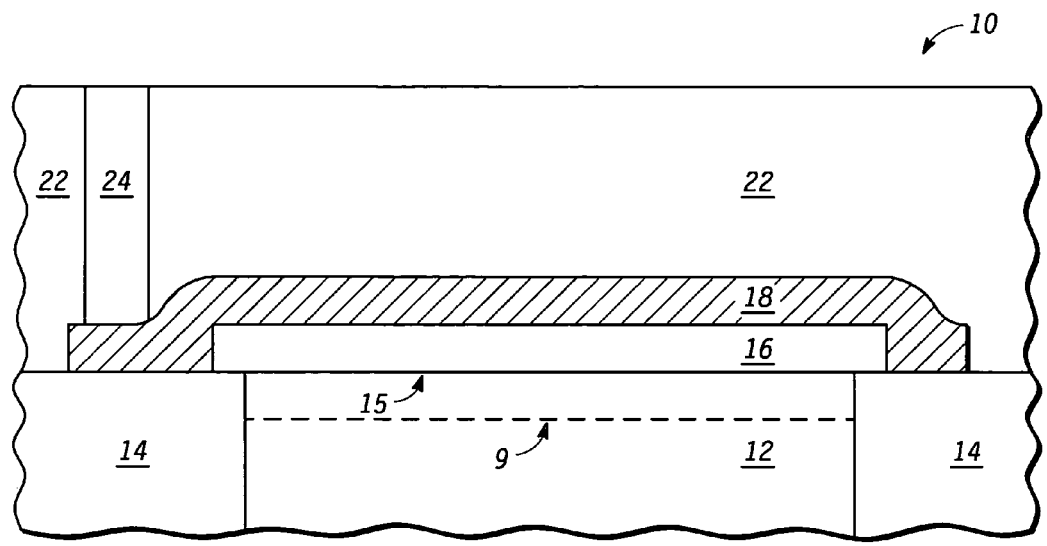

FIG. 4 illustrates an interlayer dielectric (ILD) 22 which has been deposited overlying conductive layer 18. In one embodiment, a conductive contact 24 is made to conductive layer 18. For embodiments where structure 10 is a transistor, conductive contact 24 may be a gate contact. In a currently preferred embodiment, conductive contact 24 comprises any conductive material, such as but not limited to aluminum, copper, tantalum, tungsten, titanium nitride, or appropriate conductive materials. In alternate embodiments, one or more conductive liner layers may be used in forming conductive contact 24. Although a few examples of materials that may be used to form conductive contact 24 are described here, conductive contact 24 may be made from other materials with electrical properties suitable for use as a conductive contact.

In a currently preferred embodiment, ILD layer 22 comprises silicon oxide. By way of illustration and not limitation, ILD layer 22 may also include silicon nitride, silicon oxide/silicon nitride stacks, nitrided oxides of silicon, or other dielectric materials with electrical properties suitable for use as a semiconductor device interlayer dielectric. Although a few examples of materials that may be used to form ILD layer 22 are described here, layer 22 may be made from other materials with electrical properties suitable for use as a semiconductor device dielectric.

ILD layer 22 may be formed on conductive layer 18 using a deposition method known in the art, such as a chemical vapor deposition ("CVD"), a low pressure CVD deposition ("LPCVD"), a physical vapor deposition ("PVD"), or an atomic layer deposition ("ALD") process. In most applications, the ILD layer 22 should be more than approximately 50 nanometers thick, and more preferably, between approximately 200 nanometers and approximately 600 nanometers thick.

Figure 5:
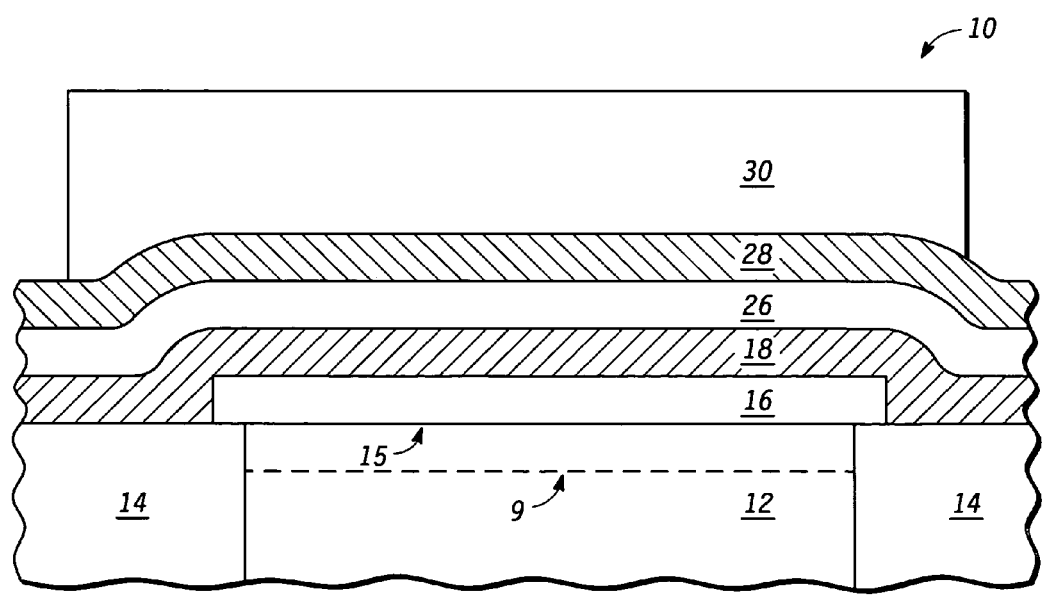
FIGS. 5–7 illustrate, in cross-sectional view form, a structure that may be formed in accordance with an alternate embodiment of the present invention.

FIGS. 1–3 and 5–7 illustrate, in cross-sectional view form, a structure that may be formed in accordance with an alternate embodiment of the present invention. FIGS. 1–3 have already been described herein. FIG. 5 illustrates a second dielectric layer 26 which is formed overlying, and preferably on, conductive layer 18. In an alternate embodiment, a second conductive layer (28) may be used in order to add sufficient carriers to efficiently invert the channel region 9 so that it becomes conductive. Additional metal layers may also be added in a similar manner.

In a currently preferred embodiment, the dielectric layer 26 comprises silicon dioxide. By way of illustration and not limitation, the dielectric layer 26 may also include silicon oxide/silicon nitride stacks, nitrided oxides of silicon, or other dielectric materials with electrical properties suitable for use as a semiconductor device gate dielectric layer 16. The dielectric layer 26 may further include materials that may be used to make high-k gate dielectrics (i.e. dielectrics having a dielectric constant that is greater than approximately 8) such as hafnium oxide, zirconium oxide, titanium oxide, and aluminum oxide. Although a few examples of materials that may be used to form the gate dielectric layer 26 are described here, that layer may be made from other materials that serve to reduce gate leakage from the level present in devices that include silicon dioxide gate dielectrics.

The dielectric layer 26 may be formed on the conductive layer 18 using a deposition method known in the art, such as a chemical vapor deposition ("CVD"), a low pressure CVD deposition ("LPCVD"), a physical vapor deposition ("PVD"), or an atomic layer deposition ("ALD") process. In most applications, the dielectric layer 26 should be less than approximately 5 nanometers thick, and more preferably, between approximately 0.7 nanometers and approximately 6 nanometers thick.

Still referring to FIG. 5, a second conductive layer 28 is deposited overlying, and preferably on, dielectric layer 26. Conductive layer 28 may be deposited using conventional methods known in the art, such as a PVD, ALD, CVD, or a metal organic chemical vapor deposition (MOCVD") process, or electron beam evaporation. The conductive layer 28 can be any thickness, but preferably between approximately 1 nanometers to approximately 50 nanometers thick.

The material chosen for the conductive layer 28 comprises any conductive layer, such as but not limited to, aluminum, copper, gold, silver, hafnium, nickel, platinum, cobalt, tantalum, tantalum carbide, molybdenum, tungsten, chromium, titanium nitride, tungsten nitrocarbide, or combinations, compounds, or alloys of any metals or appropriate conductive materials. Although a few examples of materials that may be used to form conductive layer 28 are described here, conductive layer 28 may be made from other appropriate conductive materials, including alloying, combining, or compounding a conductive material with another material that is suitable to form a conductive layer 28. Conductive layer 28 may also be comprised of a plurality of conductive layers, which are comprised of at least one different material. Note that the material or materials used to form conductive layer 28 may be the same or different than the material or materials used to form conductive layer 18.

In one embodiment, the interface between the gate dielectric layer 16 and the semiconductor substrate 12 defines an interfacial plane 15. The conductive layer 18 forms a quantization filter for carriers in a direction that is normal or perpendicular to the interfacial plane 15. Note that one or more additional conductive layers 28 may be added in order to serve as an additional source of carriers. Dielectric layers, such as dielectric layer 26, may be interposed between the plurality of conductive layers (e.g. 18 and 28). Alternately, each conductive layer 18 and/or conductive layer 28 may comprise a stacked plurality of conductive layers.

Figure 6:
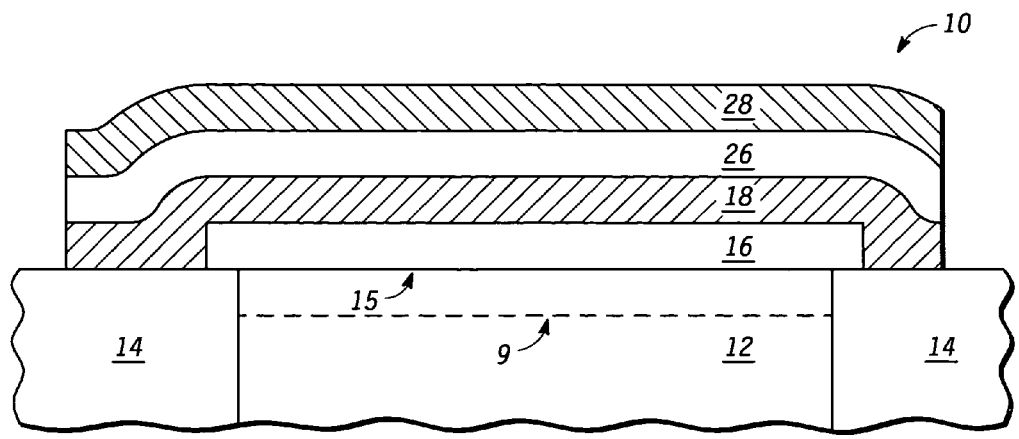

Referring to FIG. 5, in one embodiment, patterned masking layer 30 may be used to pattern conductive layer 28, dielectric layer 26, and conductive layer 18. FIG. 6 illustrates conductive layer 28, dielectric layer 26, and conductive layer 18 after patterning in accordance with one embodiment.

Figure 7:
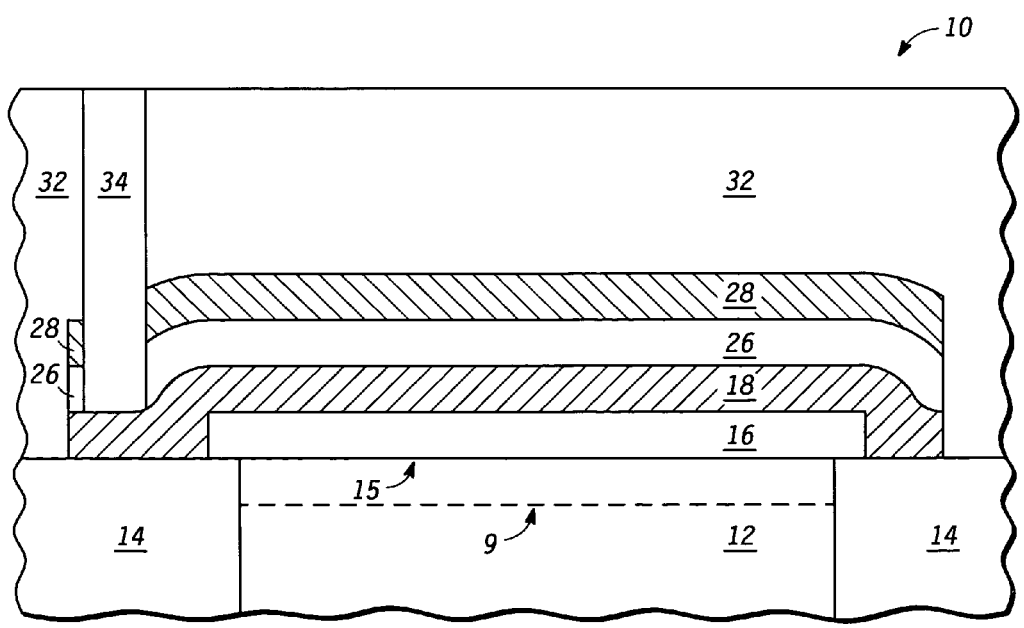

FIG. 7 illustrates an interlayer dielectric (ILD) 32 which has been deposited overlying conductive layer 28. In one embodiment, a conductive contact 34 is made to conductive layer 18. For embodiments where structure 10 is a transistor, conductive contact 34 may be a gate contact. In a currently preferred embodiment, conductive contact 34 comprises any conductive material, such as but not limited to aluminum, copper, tantalum, tungsten, titanium nitride, or appropriate conductive materials. In alternate embodiments, one or more conductive liner layers may be used in forming conductive contact 34. Although a few examples of materials that may be used to form conductive contact 34 are described here, conductive contact 34 may be made from other materials with electrical properties suitable for use as a conductive contact.

Note that in a preferred embodiment, conductive layer 18, conductive layer 28, and conductive contact 34 are electrically coupled to each other. Note that electrically coupled does not require direct physical contact for some embodiments.

In a currently preferred embodiment, ILD layer 32 comprises silicon oxide. By way of illustration and not limitation, ILD layer 32 may also include silicon nitride, silicon oxide/silicon nitride stacks, nitrided oxides of silicon, or other dielectric materials with electrical properties suitable for use as a semiconductor device interlayer dielectric. Although a few examples of materials that may be used to form ILD layer 32 are described here, layer 32 may be made from other materials with electrical properties suitable for use as a semiconductor device dielectric.

ILD layer 32 may be formed on conductive layer 28 using a deposition method known in the art, such as a chemical vapor deposition ("CVD"), a low pressure CVD deposition ("LPCVD"), a physical vapor deposition ("PVD"), or an atomic layer deposition ("ALD") process. In most applications, the ILD layer 32 should be more than approximately 50 nanometers thick, and more preferably, between approximately 200 nanometers and approximately 600 nanometers thick.

In the illustrated embodiments, a channel region 9 can be formed under the gate dielectric 16 (see FIGS. 4–7). In one embodiment, the interface between the gate dielectric layer 16 and the semiconductor substrate 12 defines an interfacial plane 15. The conductive layer 18 forms a quantization filter for carriers in a direction that is normal (i.e. perpendicular) to the interfacial plane 15. In one embodiment, a second dielectric layer (22 or 26) formed on conductive layer 18 extends along the length of the channel region.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A semiconductor device, comprising:
  a semiconductor substrate;
  a first dielectric layer on the semiconductor substrate, wherein the first dielectric layer is characterized as a gate dielectric;
  a first conductive layer on the first dielectric layer, wherein the first conductive layer has a thickness of at most approximately 4 nanometers;
  a second dielectric layer on the first conductive layer;
  a second conductive layer on the second dielectric layer; and
  a conductive contact electrically coupled to the first conductive layer and the second conductive layer.

2. The semiconductor device of claim 1, further comprising a channel region under the gate dielectric, wherein the second dielectric layer on the first conductive layer extends along a length of the channel region.

3. The semiconductor device of claim 1, wherein the thickness of the first conductive layer is at most approximately 3 nanometers.

4. The semiconductor device of claim 1, wherein the thickness of the first conductive layer is at most approximately 2 nanometers.

5. The semiconductor device of claim 1, wherein the second conductive layer is electrically coupled to the first conductive layer.

6. The semiconductor device of claim 5, further comprising:
a third dielectric layer over the second conductive layer.

7. The semiconductor device of claim 6, wherein the third dielectric is characterized as an interlayer dielectric (ILD) layer.

8. The semiconductor device of claim 1, wherein the first conductive layer comprises a metal.

9. A semiconductor device, comprising:
a semiconductor substrate;
a first dielectric layer on the semiconductor substrate, wherein the first dielectric layer is characterized as a gate dielectric;
a first conductive layer on the first dielectric layer, wherein the first conductive layer has
a thickness of at most approximately 4 nanometers;
a second dielectric layer on the first conductive layer;
a second conductive layer in direct contact with the second dielectric layer and electrically coupled to the first conductive layer; and
a conductive contact electrically coupled to the first conductive layer and the second conductive layer.

10. The semiconductor device of claim 9, further comprising:
a third dielectric layer over the second conductive layer.

11. The semiconductor device of claim 10, wherein the third dielectric layer is characterized as an ILD layer.

12. The semiconductor device of claim 9, further comprising a channel region under the gate dielectric, wherein the second dielectric layer on the first conductive layer extends along a length of the channel region.

13. The semiconductor device of claim 9, wherein the thickness of the first conductive layer is at most approximately 3 nanometers.

14. The semiconductor device of claim 9, wherein the thickness of the first conductive layer is at most approximately 2 nanometers.

15. The semiconductor device of claim 9, wherein the first conductive layer comprises a first metal and the second conductive layer comprises a second metal.

16. The semiconductor device of claim 15, wherein the first metal and the second metal are a same metal.

17. A semiconductor device, comprising:
a semiconductor substrate;
a first dielectric layer on the semiconductor substrate, wherein the first dielectric layer is characterized as a gate dielectric, and wherein an interface between the first dielectric layer and the semiconductor substrate defines an interfacial plane;
a first conductive layer on the first dielectric layer, wherein the first conductive layer forms a quantization filter for carriers in a direction that is normal to the interfacial plane;
a second dielectric layer on the first conductive layer;
a second conductive layer on the second dielectric layer; and
a conductive contact electrically coupled to the first conductive layer and the second conductive layer.

18. The semiconductor device of claim 17, further comprising a channel region under the gate dielectric, wherein the second dielectric layer on the first conductive layer extends along a length of the channel region.

19. The semiconductor device of claim 17, wherein the thickness of the first conductive layer is at most approximately 4 nanometers.

20. The semiconductor device of claim 17, wherein the thickness of the first conductive layer is at most approximately 3 nanometers.

21. The semiconductor device of claim 17, wherein the thickness of the first conductive layer is at most approximately 2 nanometers.

22. The semiconductor device of claim 17, wherein the first conductive layer comprises a metal.

23. The semiconductor device of claim 18, further comprising:
a third dielectric layer over the second conductive layer.

24. The semiconductor device of claim 23, wherein the third dielectric layer is characterized as an ILD layer.

25. The semiconductor of claim 18, wherein the second conductive layer comprises a metal.

* * * * *